(12) United States Patent
Chen et al.

(10) Patent No.: US 11,581,169 B2
(45) Date of Patent: Feb. 14, 2023

(54) ION COLLECTOR FOR USE IN PLASMA SYSTEMS

(71) Applicant: Taiwan Semiconductor Manufacturing Co., Ltd., Hsinchu (TW)

(72) Inventors: Otto Chen, Hsinchu (TW); Chi-Ying Wu, Hsinchu (TW); Chia-Chih Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 286 days.

(21) Appl. No.: 16/704,858

(22) Filed: Dec. 5, 2019

(65) Prior Publication Data

US 2020/0111651 A1    Apr. 9, 2020

Related U.S. Application Data

(62) Division of application No. 14/850,623, filed on Sep. 10, 2015, now Pat. No. 10,553,411.

(51) Int. Cl.
*H01J 37/32* (2006.01)
*H01J 37/244* (2006.01)

(52) U.S. Cl.
CPC ...... *H01J 37/32935* (2013.01); *H01J 37/244* (2013.01); *H01J 37/3266* (2013.01); *H01J 37/32146* (2013.01); *H01J 37/32155* (2013.01); *H01J 37/32449* (2013.01); *H01J 2237/24405* (2013.01); *H01J 2237/24465* (2013.01); *H01J 2237/24507* (2013.01); *H01J 2237/24564* (2013.01)

(58) Field of Classification Search
CPC ......... H01J 37/32935; H01J 2237/2446; H01J 2237/24465; H01J 2237/31703
See application file for complete search history.

(56) References Cited

U.S. PATENT DOCUMENTS

| 4,228,358 A | 10/1980 | Ryding |
|---|---|---|
| 4,234,797 A | 11/1980 | Ryding |
| (Continued) | | |

FOREIGN PATENT DOCUMENTS

| CN | 101015034 A | 8/2007 |
|---|---|---|
| CN | 101401187 A | 4/2009 |
| (Continued) | | |

*Primary Examiner* — Eliza W Osenbaugh-Stewart
(74) *Attorney, Agent, or Firm* — Sterne, Kessler, Goldstein & Fox P.L.L.C.

(57) ABSTRACT

An ion collector includes a plurality of segments and a plurality of integrators. The plurality of segments are physically separated from one another and spaced around a substrate support. Each of the segments includes a conductive element that is designed to conduct a current based on ions received from a plasma. Each of the plurality of integrators is coupled to a corresponding conductive element. Each of the plurality of integrators is designed to determine an ion distribution for a corresponding conductive element based, at least in part, on the current conducted at the corresponding conductive element. An example benefit of this embodiment includes the ability to determine how uniform the ion distribution is across a wafer being processed by the plasma.

20 Claims, 13 Drawing Sheets

(56) References Cited

U.S. PATENT DOCUMENTS

| | | |
|---|---|---|
| 4,539,217 A | 9/1985 | Farley |
| 4,587,433 A | 5/1986 | Farley |
| 4,628,209 A | 12/1986 | Wittkower |
| 4,751,393 A | 6/1988 | Corey, Jr. et al. |
| 5,319,212 A | 6/1994 | Tokoro |
| 5,525,807 A | 6/1996 | Hirokawa et al. |
| 5,608,223 A | 3/1997 | Hirokawa et al. |
| 5,653,811 A | 8/1997 | Chan |
| 5,760,409 A | 6/1998 | Chen et al. |
| 5,814,823 A | 9/1998 | Benveniste |
| 5,989,349 A | 11/1999 | Ke |
| 6,020,592 A | 2/2000 | Liebert et al. |
| 6,051,073 A | 4/2000 | Chu et al. |
| 6,101,971 A | 8/2000 | Denholm et al. |
| 6,120,660 A | 9/2000 | Chu et al. |
| 6,182,604 B1 | 2/2001 | Goeckner et al. |
| 6,186,091 B1 | 2/2001 | Chu et al. |
| 6,213,050 B1 | 4/2001 | Liu et al. |
| 6,217,724 B1 | 4/2001 | Chu et al. |
| 6,228,176 B1 | 5/2001 | Chu et al. |
| 6,237,527 B1 | 5/2001 | Kellerman et al. |
| 6,269,765 B1 | 8/2001 | Chu et al. |
| 6,300,227 B1 | 10/2001 | Liu et al. |
| 6,300,643 B1 | 10/2001 | Fang et al. |
| 6,323,497 B1 | 11/2001 | Walther |
| 6,335,536 B1 | 1/2002 | Goeckner et al. |
| 6,347,919 B1 | 2/2002 | Ryan et al. |
| 6,433,553 B1 | 8/2002 | Goeckner et al. |
| 6,458,430 B1 | 10/2002 | Bernstein et al. |
| 6,600,163 B2 | 7/2003 | Halling |
| 6,828,572 B2 | 12/2004 | Reece et al. |
| 6,885,153 B2 | 4/2005 | Quon |
| 6,902,646 B2 | 6/2005 | Mahoney et al. |
| 6,965,116 B1 | 11/2005 | Wagner et al. |
| 7,009,193 B2 | 3/2006 | Garza et al. |
| 7,132,672 B2 | 11/2006 | Walther et al. |
| RE40,008 E | 1/2008 | Walther |
| 7,326,937 B2 | 2/2008 | Mehta et al. |
| 7,396,746 B2 | 7/2008 | Walther et al. |
| 7,453,059 B2 | 11/2008 | Koo et al. |
| 7,476,849 B2 | 1/2009 | Koo et al. |
| 7,531,469 B2 | 5/2009 | Ramaswamy et al. |
| 7,586,100 B2 | 9/2009 | Raj et al. |
| 7,620,511 B2 | 11/2009 | Shannon et al. |
| 7,666,464 B2 | 2/2010 | Collins |
| 7,675,730 B2 | 3/2010 | Walther et al. |
| 7,691,226 B2 | 4/2010 | Denpoh |
| 7,777,179 B2 | 8/2010 | Chen et al. |
| 7,875,859 B2 | 1/2011 | Chen et al. |
| 8,545,669 B2 | 10/2013 | Mahoney et al. |
| 8,698,107 B2 | 4/2014 | Godet et al. |
| 8,816,281 B2 | 8/2014 | Funk et al. |
| 9,087,677 B2 | 7/2015 | Funk et al. |
| 9,210,790 B2 | 12/2015 | Hoffman et al. |
| 9,536,749 B2 | 1/2017 | Marakhtanov et al. |
| 9,666,417 B2 | 5/2017 | Orimoto et al. |
| 2001/0002584 A1 | 6/2001 | Liu et al. |
| 2001/0017109 A1 | 8/2001 | Liu et al. |
| 2001/0042827 A1 | 11/2001 | Fang et al. |
| 2002/0029850 A1 | 3/2002 | Chan |
| 2002/0030167 A1 | 3/2002 | Liebert et al. |
| 2002/0036264 A1 | 3/2002 | Nakasuji et al. |
| 2002/0109090 A1 | 8/2002 | Nakasuji et al. |
| 2002/0148961 A1 | 10/2002 | Nakasuji et al. |
| 2002/0148975 A1 | 10/2002 | Kimba et al. |
| 2003/0101935 A1 | 6/2003 | Walther |
| 2003/0181068 A1 | 9/2003 | Downey |
| 2003/0192474 A1 | 10/2003 | Smick et al. |
| 2004/0016402 A1 | 1/2004 | Walther et al. |
| 2004/0096037 A1 | 5/2004 | Tang et al. |
| 2004/0112536 A1 | 6/2004 | Quon |
| 2005/0031796 A1* | 2/2005 | Wu ............... H01J 37/32174 118/715 |
| 2005/0034811 A1 | 2/2005 | Mahoney et al. |
| 2005/0133736 A1 | 6/2005 | Chen et al. |
| 2005/0151544 A1 | 7/2005 | Mahoney et al. |
| 2005/0191409 A1 | 9/2005 | Murrell et al. |
| 2005/0223991 A1 | 10/2005 | Walther et al. |
| 2005/0260354 A1 | 11/2005 | Singh et al. |
| 2005/0260837 A1 | 11/2005 | Walther et al. |
| 2006/0043063 A1 | 3/2006 | Mahoney et al. |
| 2006/0088655 A1 | 4/2006 | Collins et al. |
| 2006/0099830 A1 | 5/2006 | Walther et al. |
| 2006/0121704 A1 | 6/2006 | Walther et al. |
| 2006/0214593 A1 | 9/2006 | Denpoh |
| 2006/0219952 A1 | 10/2006 | Mehta et al. |
| 2007/0069157 A1 | 3/2007 | Mehta et al. |
| 2007/0210248 A1 | 9/2007 | Koo et al. |
| 2007/0227231 A1 | 10/2007 | Koo et al. |
| 2007/0289359 A1 | 12/2007 | Shannon et al. |
| 2008/0026133 A1 | 1/2008 | Fang et al. |
| 2008/0032427 A1 | 2/2008 | Lee et al. |
| 2008/0075834 A1 | 3/2008 | Ramaswamy et al. |
| 2008/0160170 A1 | 7/2008 | Miller et al. |
| 2008/0178803 A1 | 7/2008 | Collins et al. |
| 2008/0179284 A1 | 7/2008 | Hayes et al. |
| 2008/0188013 A1 | 8/2008 | Cho et al. |
| 2008/0289576 A1 | 11/2008 | Lee et al. |
| 2008/0314731 A1 | 12/2008 | Walther et al. |
| 2008/0318345 A1 | 12/2008 | Persing et al. |
| 2009/0068769 A1 | 3/2009 | Okumura et al. |
| 2009/0084987 A1 | 4/2009 | Godet et al. |
| 2009/0101848 A1 | 4/2009 | Walther et al. |
| 2009/0104761 A1 | 4/2009 | Jeon et al. |
| 2009/0195777 A1 | 8/2009 | Ramaswamy et al. |
| 2009/0200461 A1 | 8/2009 | Raj et al. |
| 2009/0242790 A1 | 10/2009 | Chen et al. |
| 2009/0242791 A1 | 10/2009 | Chen et al. |
| 2010/0006225 A1 | 1/2010 | Yokogawa et al. |
| 2010/0062547 A1 | 3/2010 | Hadidi et al. |
| 2011/0042578 A1 | 2/2011 | Murrell et al. |
| 2011/0265821 A1 | 11/2011 | Tay et al. |
| 2012/0145895 A1 | 6/2012 | Biberger et al. |
| 2012/0248322 A1 | 10/2012 | Funk et al. |
| 2012/0252141 A1 | 10/2012 | Sundararajan et al. |
| 2012/0253497 A1 | 10/2012 | Prager et al. |
| 2013/0043404 A1 | 2/2013 | Matsumoto |
| 2014/0062303 A1 | 3/2014 | Hoffman et al. |
| 2014/0182357 A1 | 7/2014 | Miyauchi |
| 2014/0253092 A1 | 9/2014 | Jeon et al. |
| 2016/0172216 A1 | 6/2016 | Marakhtanov et al. |
| 2016/0211123 A1 | 7/2016 | Orimoto et al. |
| 2017/0062186 A1 | 3/2017 | Coumou et al. |
| 2017/0076920 A1 | 3/2017 | Chen et al. |

FOREIGN PATENT DOCUMENTS

| | | |
|---|---|---|
| JP | 2012-212894 A | 11/2012 |
| TW | 200601437 A | 1/2006 |
| TW | 200828390 A | 7/2008 |
| TW | 201137965 A | 11/2011 |
| TW | 1388243 B | 3/2013 |
| WO | WO-2015029777 A1 | 3/2015 |

* cited by examiner

A' cross-section

B' cross-section

ION COLLECTOR FOR USE IN PLASMA SYSTEMS

CROSS-REFERENCE TO RELATED APPLICATIONS

This application claims priority to U.S. patent application Ser. No. 14/850,623, titled "Ion Collector for Use in Plasma Systems," filed Sep. 10, 2015, the disclosure of which is incorporated by reference herein in its entirety.

BACKGROUND

Plasma systems are frequently used in the industry for performing various semiconductor manufacturing processes. Plasma systems have been used to clean contamination from the surfaces of wafers, to deposit material layers, for etching, for ion implantation, and for plasma doping just to name a few examples. For any given process step, hundreds of wafers may undergo the process in a given day. As such, any issues or problems with the plasma system can have a significant impact on the number of good die per wafer.

Special detectors that measure the number of ions from the plasma (sometimes known as dosimeters) may be used to measure the plasma ion distribution during a process. The ion distribution may be monitored to determine if the plasma system needs to be taken off-line for readjustment.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

Figure 1A:
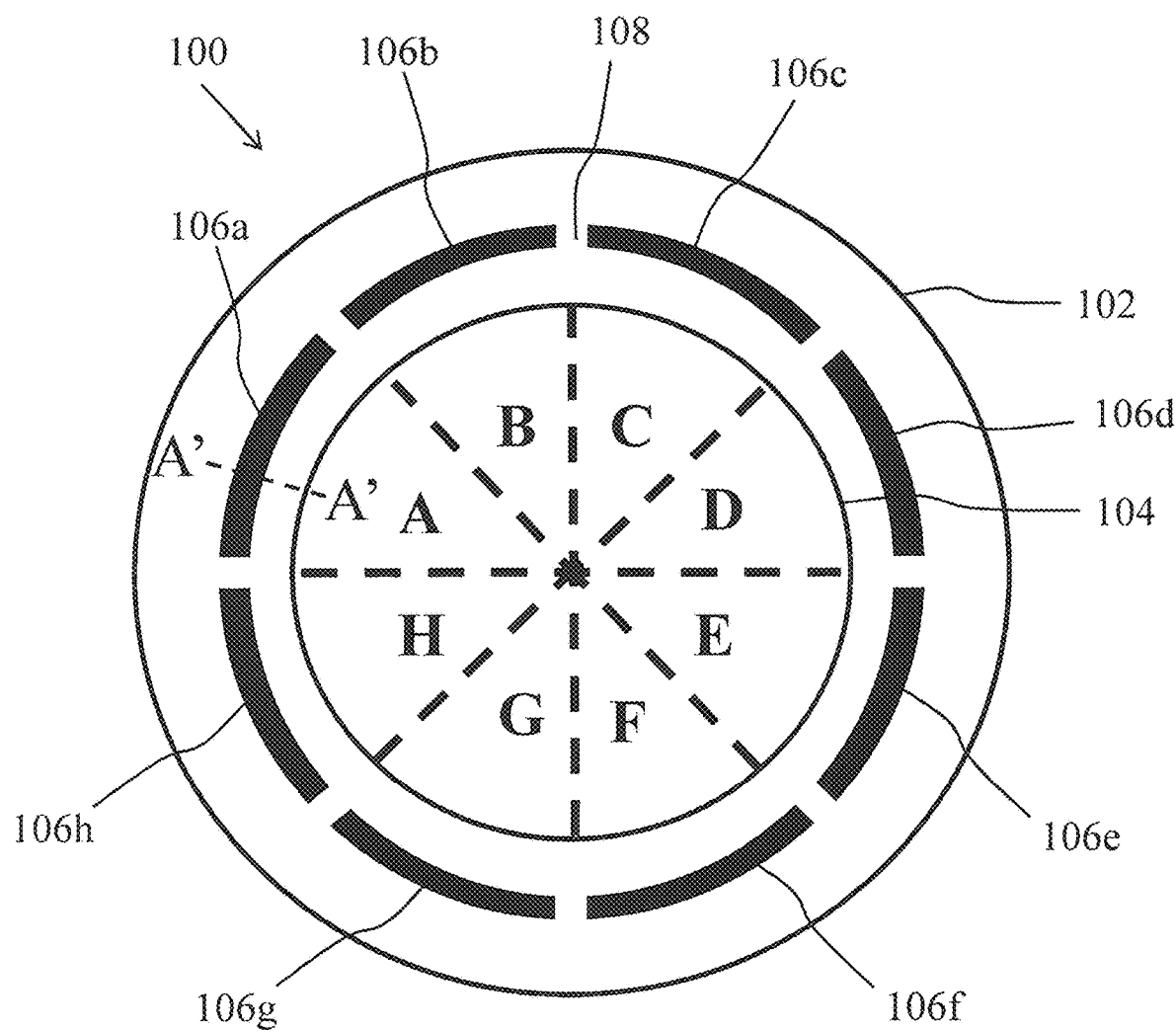
FIGS. 1A and 1B illustrate views of a wafer stage with an integrated ion collector, in accordance with some embodiments.

Embodiments of the present invention will be described with reference to the accompanying drawings.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

Figure 1B:
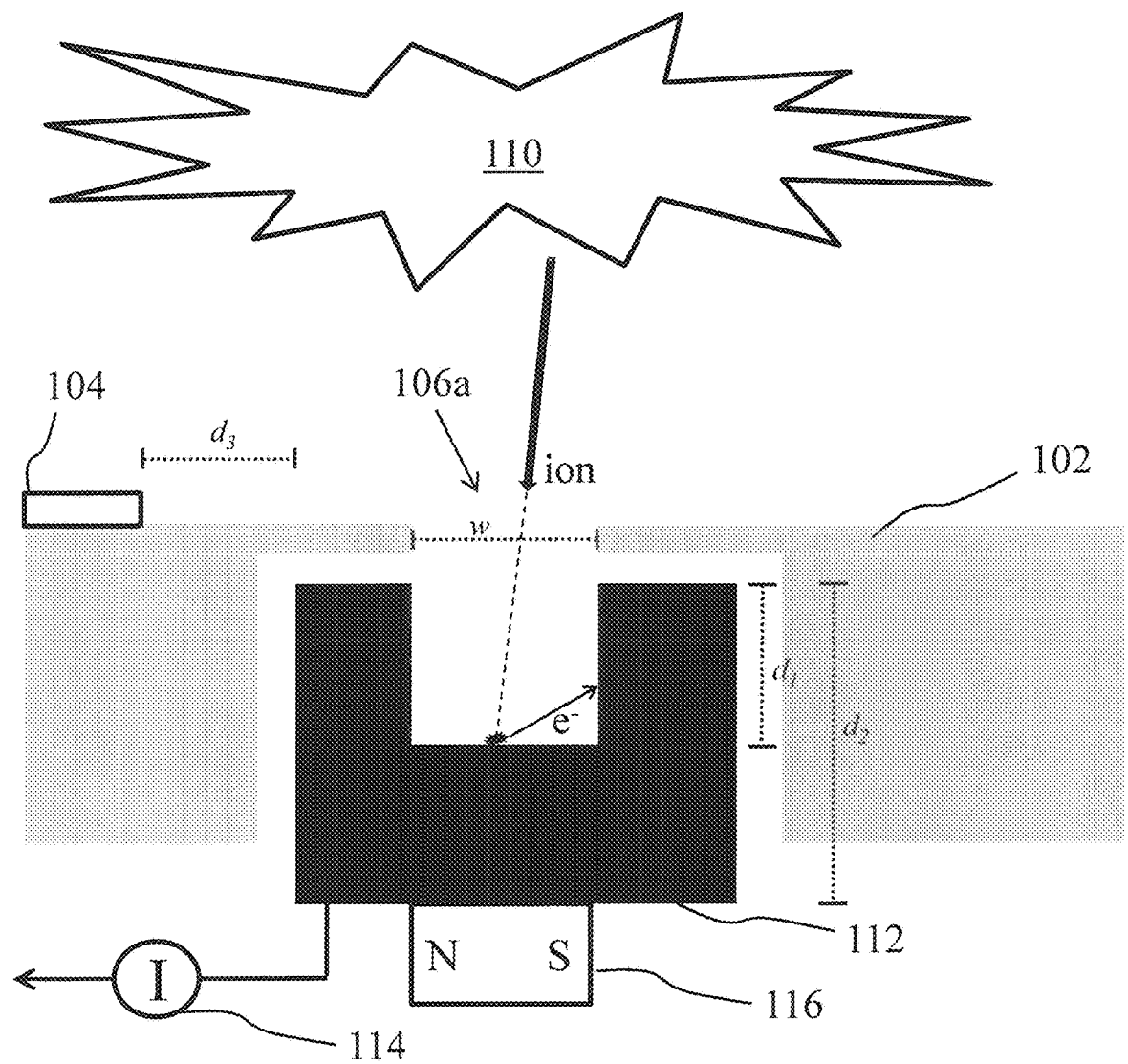

FIG. 1A illustrates a stage system 100, according to an embodiment. FIG. 1B illustrates a cross section of stage system 100 taken across line A'-A'. Stage system 100 includes a support 102 that is designed to support a wafer 104. Support 102 may comprise any material for use in a lithographic system as would be known to a person skilled in the art. For example, a common material for support 102 is steel. Support 102 may include a vacuum system for holding wafer 104 in place. In another example, support 102 includes an electrostatic chuck to clamp wafer 104 in place via an applied potential.

According to an embodiment, support 102 includes a series of trench-like openings around the outside of wafer 104. Each of the trench-like openings includes a segment 106a-106h of an ion collector. It should be understood that description herein of segment 106a may also apply to any other segment. Each segment 106a-106h may be physically separated by a wall 108. Each segment may also be electrically isolated from one another via an insulating material or high-k dielectric material placed between the segments. The total number and arrangement of segments may vary. For example, any number of segments may be arranged in a circular pattern as shown with each segment separated from one another via wall 108. The arrangement of the segments is not limited to the circular pattern illustrated. For example, the segments may be arranged in any shape or configuration as long as they are arranged outside of the edge of wafer 104. The segments may be arranged as close as possible to the edge of wafer 104. In one example, segments 106a-106h are arranged such that a distance between a given segment and its nearest two neighboring segments is the same for each segment.

During a plasma process, ions generated from the plasma bombard wafer 104 across its surface, and will also pass through each of the trench-like openings and impinge upon each segment 106a-106h of an ion collector. By measuring the total charge associated with the ions that pass through each trench-like opening, information can be determined regarding the plasma ion distribution at (or at least near) wafer 104. As used herein, the term "ion distribution" relates to the total charge accumulated across a given area (such as a given segment) due to the ions impacting across the given area. The ion distribution increases if the total number of ions across the given area increases. Additionally, the ion distribution increases with increasing charge of each ion.

Because the ion collector incudes multiple segments 106a-106h that are physically and/or electrically separated from one another, information about the uniformity of the plasma can also be determined. For example, segment 106a is associated with a closest portion 'A' of wafer 104, while segment 106b is associated with a closest portion 'B' of wafer 104, and so forth. Since the ion distribution is individually measurable at each segment 106a-106h, the uniformity of the plasma process across the surface of the wafer can be monitored. The ability to monitor this uniformity becomes even more important as the size of wafer 104 increases. For example, when using 450 mm or 18" diameter wafers, any changes to the plasma uniformity can have a significant impact on the yield of devices across such a large footprint. Additionally, a segmented ion collector design like the one illustrated in FIG. 1A can be used with single wafer or multiple wafer systems to monitor the plasma uniformity. The plasma may be used to dope wafer 104 with a variety of elements, such as boron, phosphorus, arsenic, or germanium.

The edge of wafer 104 can be seen on support 102 in the cross section illustration of FIG. 1B. Support 102 has a trench-like opening through which lies segment 106a, according to an embodiment. The opening allows ions from plasma 108 to pass through and impinge upon a conductive element 112. The width of the opening may be tailored based on the application and the total number of ions that are expected to be generated. For example, the width of the opening may be between 1 and 3 mm, between 3 and 5 mm, or between 5 and 10 mm. Plasma 108 may be generated from the ionization of a wide array of source gases such as argon, chlorofluorocarbons, helium, etc., depending on the application. The generation and physics of the plasma are not discussed in any further detail in this application.

Conductive element 112 may be any metallic material that can conduct a current. Example conductive materials include copper, aluminum, stainless steel, carbon, and graphite. Conductive element 112 may be a Faraday cup, in that it is shaped like a cup with walls designed to catch ions at various angles and also to catch stray charges that are generated when an ion hits conductive element 112 and is neutralized. The walls of the cup may be at right angles, as illustrated, or they may be curved. Conductive element 112 may include an open area, the "cup", that has a width w similar to the width of the opening above it as illustrated in FIG. 1B. In some embodiments, the walls of the cup may have a first depth $d_1$ that extends between about 25% to about 50% of the total depth $d_2$ of conductive element 112. In some other embodiments, the walls of the cup may have a first depth $d_1$ that extends between about 50% to about 75% of the total depth $d_2$ of conductive element 112. The total depth $d_2$ of conductive element 112 may range anywhere between about 10 mm and 100 mm. Note that all of the dimensions provided are purely exemplary, and other dimensions could be used as well without deviating from the scope or spirit of the embodiments described herein.

Conductive element 112 is provided as an element in a circuit such that a current 114 can be measured directly from conductive element 112. The measured current is related to both the number and charge of the ions impacting upon conductive element 112 in segment 106a. According to an embodiment, a magnetic element 116 is included. A magnetic field generated from magnetic element 116 may help prevent secondary electrons from escaping away from conductive element 112.

The space between conductive element 112 and support 102 may be filled with a material to hold conductive element 112 in place. The filling material would ideally be non-conductive, such as a polymer or epoxy. In another example, the space between conductive element 112 and support 102 is mostly open space except for attachment points made between conductive element 112 and support 102 to hold conductive element 112 in place.

Conductive element 112 is spaced some distance $d_3$ away from wafer 104, but is preferably close to wafer 104 to more accurately measure uniformity of the plasma ions across the surface of wafer 104. In some embodiments, conductive element 112 is spaced in a range from about 2 mm to about 5 mm from wafer 104. In some other embodiments, conductive element 112 is spaced in a range from about 5 mm to about 10 mm from wafer 104. In some other embodiments, conductive element 112 is spaced in a range from about 10 mm to about 20 mm from wafer 104.

Embodiments of an ion collector described herein may be used during any plasma process for the formation of a variety of semiconductor devices. Some example plasma processes include ion implantation, plasma etching, PECVD, PEALD, and epitaxial growth.

Figure 2:
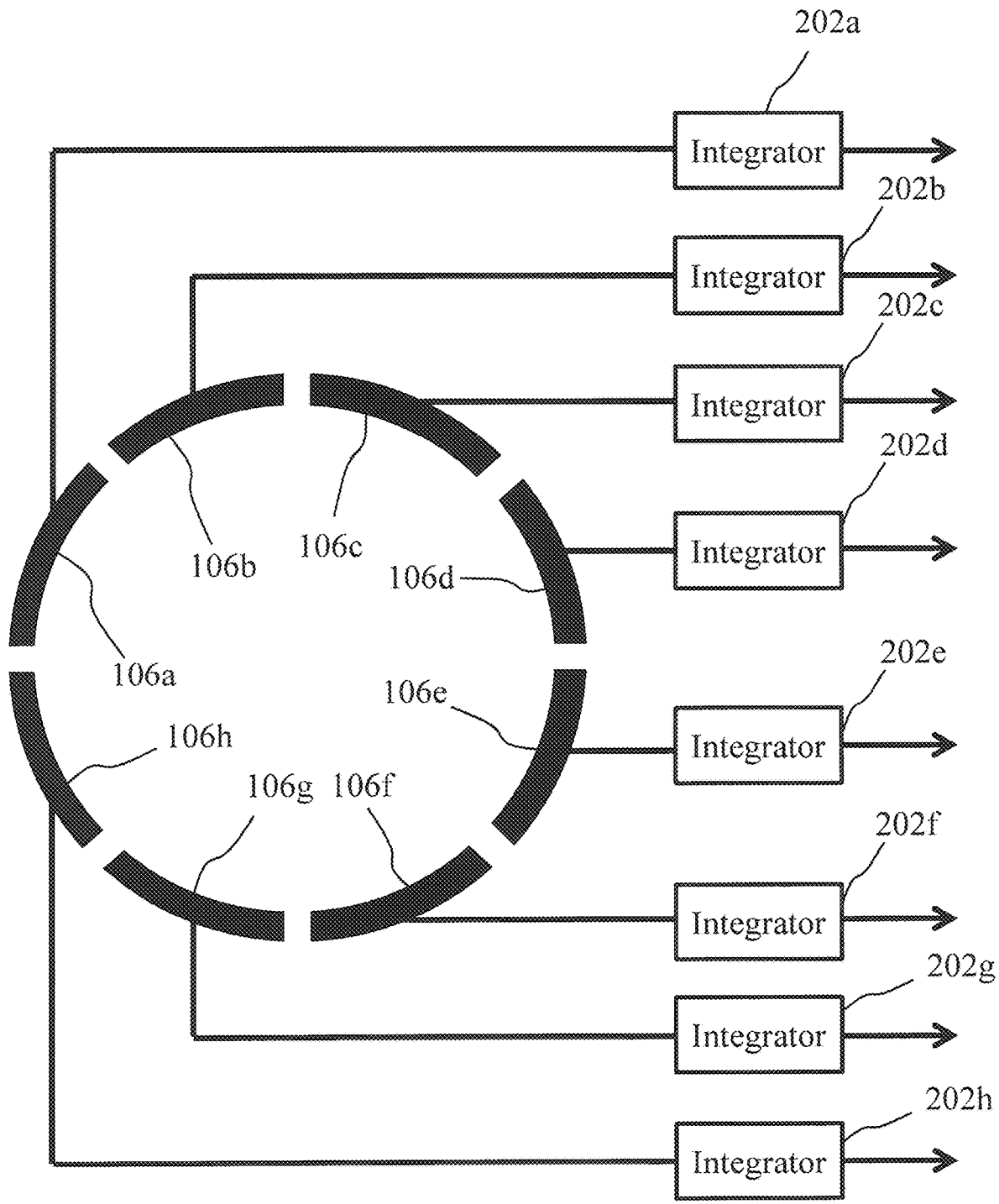
FIG. 2 illustrates connections made to segments of a ion collector, in accordance with some embodiments.

FIG. 2 illustrates a parallel circuit arrangement for connecting to each ion collector segment 106a-106h, according to an embodiment. Each segment 106a-106h is respectively electrically coupled with an integrator 202a-202h. Each integrator 202a-202h may include various passive and/or active electrical components necessary for measuring a current based on the accumulated charge in the corresponding segment. For example, each of integrator 202a-202h may include an ammeter or galvanometer, the operation of which would be understood to one skilled in the art. From the received current, each integrator 202a-202h determines an ion distribution based on the received current and the area of the corresponding conductive element exposed to the ions. As such, each integrator 202a-202h may include processing circuitry and/or logic designed to make such a determination. Additionally, the ion distribution information may be stored in registers or addressable memory associated with each integrator 202a-202h.

The determined ion distribution information may be provided from each integrator 202a-202h to a user via a user interface. For example, a display mounted to or otherwise electrically coupled with a plasma system may display graphically, or numerically, the ion distribution information from various locations around the wafer for the current plasma process. In another embodiment, the ion distribution information is passed along to a controller that provides automatic control of various parameters of the plasma system to compensate for any determined non-uniformity of the ion distribution across the wafer.

In another embodiment, a single integrator is used with a plurality of inputs to receive the current from each segment 106a-106h. The single integrator may include processing circuitry and/or logic designed to determine an ion distribution for each of the received currents, and provide the ion distribution information across a plurality of outputs.

In an embodiment, the single integrator may use a single input and single output and use various time or frequency modulation techniques to receive the different current values and provide the ion distribution information for multiple segments 106a-106h. For example, frequency division multiplexing may be performed to assign a different frequency (or phase) modulation to each signal received from each segment 106a-106h, such that the various signals can be received at one integrator input. Then, the signals may be demodulated to match which signal came from which segment.

Figure 3:
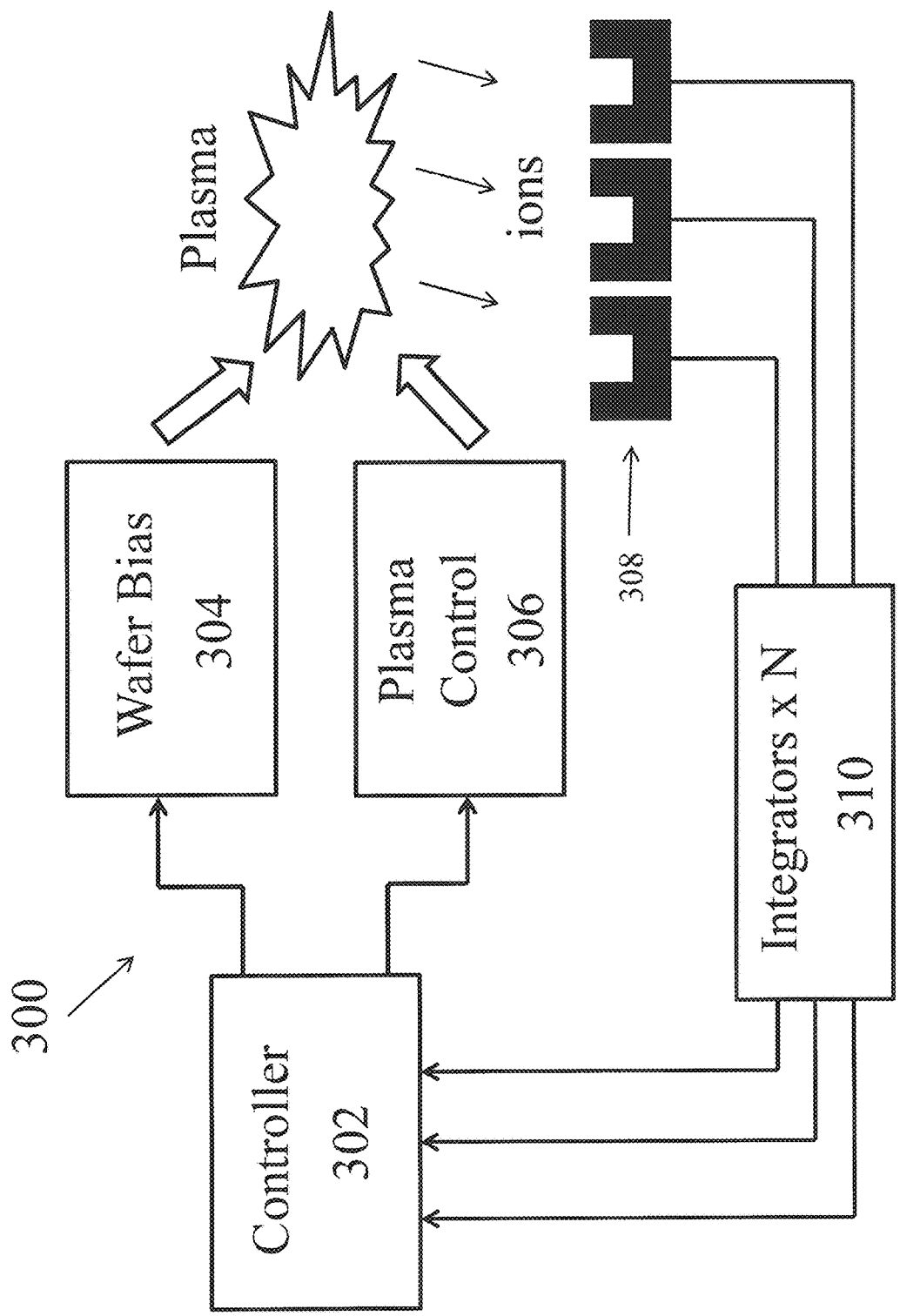
FIG. 3 illustrates a control system, in accordance with some embodiments.

FIG. 3 illustrates a control system 300 for correcting non uniformity of the ion distribution across a wafer, according to an embodiment. According to an embodiment, control system 300 may be used with the segmented ion collector design illustrated in FIG. 1A. Control system 300 includes a controller 302 that includes processing circuitry and/or logic designed to receive ion distribution information from each of integrators 310 and use that information to control parameters of the plasma system to compensate for any non-uniform measurements in real time. Various segments 308 may be arranged around a wafer stage to collect the ions generated from a plasma. In an example, segments 308 are arranged in a circular pattern around the chuck that holds a wafer, such as the pattern illustrated in FIG. 1A. The illustration of only three segments 308 is for example only, and it should be understood that any number of segments 308 and corresponding integrators 310 may be used.

Controller 302 may be capable of shutting off the plasma source if the non-uniformity is greater than a given threshold. This may be based on any number of possible comparisons. For example, and with reference to FIG. 1A, if segment 106a is measuring an ion distribution that is twice as high as the next highest ion distribution measurement, then controller 302 would shut off the plasma source and issue a warning or alert to the user that the system requires maintenance. The user could also be provided with information that includes specifically which segment registered the out-of-bounds measurement. In another example, controller 302 shuts off the plasma source and issues a warning or alert if a standard deviation among all ion distribution measurements is higher than a given threshold. Other methods of comparing measurements to determine a degree of uniformity would be understood to a person skilled in the art.

In other examples, controller 302 may just issue warnings about the plasma uniformity, but continue running the plasma process. Test wafers may be used during the process of measuring the plasma ion distribution to ensure a uniform distribution before production wafers are used. In this scenario, there would not be a need to shut off the plasma system when running a process on a test wafer.

In an embodiment, upon receipt of the ion distribution information from various segments 308, controller 302 may adjust the bias voltage applied to all of (or portions of) the wafer (or wafers) being processed in an attempt to correct the plasma uniformity in real time. Block 304 represents the adjustment being made to the wafer bias potential. The change to the wafer bias changes the electric field strength around the wafer, which in turn affects how the ions interact with the wafer surface.

Alternatively, or additionally, upon receipt of the ion distribution information from various segments 308, controller 302 may adjust parameters of the plasma source to affect characteristics of the plasma. Block 306 represents the adjustment being made to the plasma source. Examples of plasma parameters to control include gas concentrations, gas flow rates, and E-field intensity. A multi-zone plasma system may be controlled to affect the plasma over specific regions of the wafer. For example, and with reference to FIG. 1A, if segment 106a measured an ion distribution that was higher than the ion distribution measurements from the neighboring segments, the multi-zone plasma system may be adjusted by controller 302 such that the ion concentration (or total ion charge) would change primarily over section 'A' of wafer 104. In another example, the multi-zone plasma system may be adjusted by controller 302 to affect the ion concentration over each section of wafer 104.

Controller 302 may compare the received ion distribution measurements and determine that no change needs to be made to any of the plasma system parameters. For example, if the ion distribution measurements are all within a given threshold of one another, controller 302 may continue to monitor, but not take any action to change either the wafer bias potential (block 304) or the plasma source parameters (block 306.)

Figure 4A:
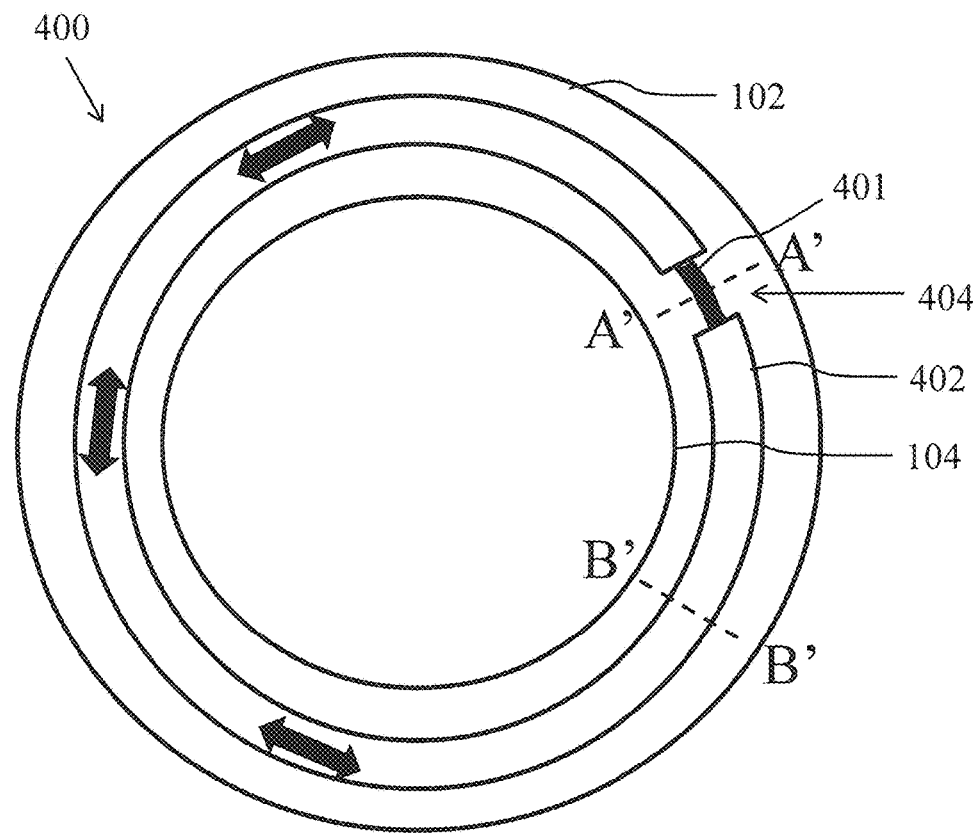
FIGS. 4A-4C illustrate another wafer stage with an integrated ion collector, in accordance with some embodiments.

FIG. 4A illustrates a stage system 400, according to another embodiment. Stage system 400 includes support 102 that is designed to support wafer 104 similar to stage system 100. However, stage system 400 includes a single continuous trench-like opening that includes a continuous conductive element 401 of an ion collector. Conductive element 401 has a continuous closed shape, such as a circular shape arranged around a wafer chuck on support 102 as illustrated. According to an embodiment, conductive element 401 is mostly protected from the plasma ions by a cover 402, except for a window 404. As noted by the double-ended arrows, cover 402 may be designed to rotate such that window 404 correspondingly moves across the closed shape of conductive element 401 in either a clockwise or counter-clockwise direction. In this way, a particular area of conductive element 401 that receives ions from the plasma can be controlled. Cover 402 may be any material that prevents the ions from penetrating through a thickness of cover 402. Although only one window 404 is illustrated, it should be understood that any number of windows may be used through cover 402. The multiple windows may be spaced apart equally around cover 402. Window 404 may be any size that, when rotated at a given speed, provides a complete measurement of the plasma ion distribution around the edge of wafer 104. In some embodiments, window 404 extends in a range from about 1% to about 5% of the total circumference of cover 402. In some other embodiments, window 404 extends in a range from about 5% to about 10% of the total circumference of cover 402. In some other embodiments, window 404 extends in a range from about 10% to about 15% of the total circumference of cover 402.

The rotation speed of cover 402 may be adjustable. In one example, the rotation speed is adjusted based on a diameter of conductive element 401. For larger ion collectors used with larger wafer sizes, the speed may be increased to measure the area around the wafer faster through window 404. The size of window 404 may also be increased to allow more ions to be collected, at the cost of a finer resolution. It would be within the knowledge of a person skilled in the art to design a size of window 404 and set a speed of cover 402 to adequately measure ion distribution for a given application.

Figure 4B:
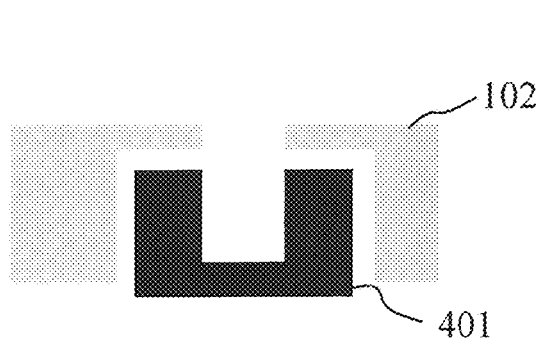
Figure 4C:
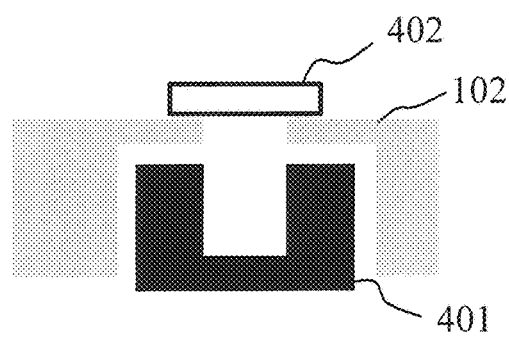

Cross sections taken across 'A' and 'B' are shown in FIGS. 4B and 4C, respectively. Cross section 'A' illustrates where ions can impinge upon conductive element 401 through window 404. Cross section 'B' illustrates a portion of conductive element 401 that is protected by cover 402, thus preventing ions from reaching conductive element 401 in this area. Since conductive element 401 is one continuous shape, only a single electrical connection needs to be made to conductive element 401 to receive the current that conducts through conductive element 401. This current is generated from the ions that impinge upon conductive element 401 through window 404. Although not illustrated, it should be understood that conductive element 401 may also include a magnetic element such as magnetic element 116 described with reference to FIG. 1B.

By moving window 404 along the closed shape of conductive element 401, an ion distribution can be determined for various areas around wafer 104. As such, a position of window 404 is also monitored and compared with the measured current for a given time to determine what area corresponds to the determined ion distribution. Monitoring of the position of window 404 may be performed via the use of position sensors such as with IR sensors. Capacitive or electrostatic sensors may also be used by patterning electrodes on both cover 402 and support 102.

Figure 5:
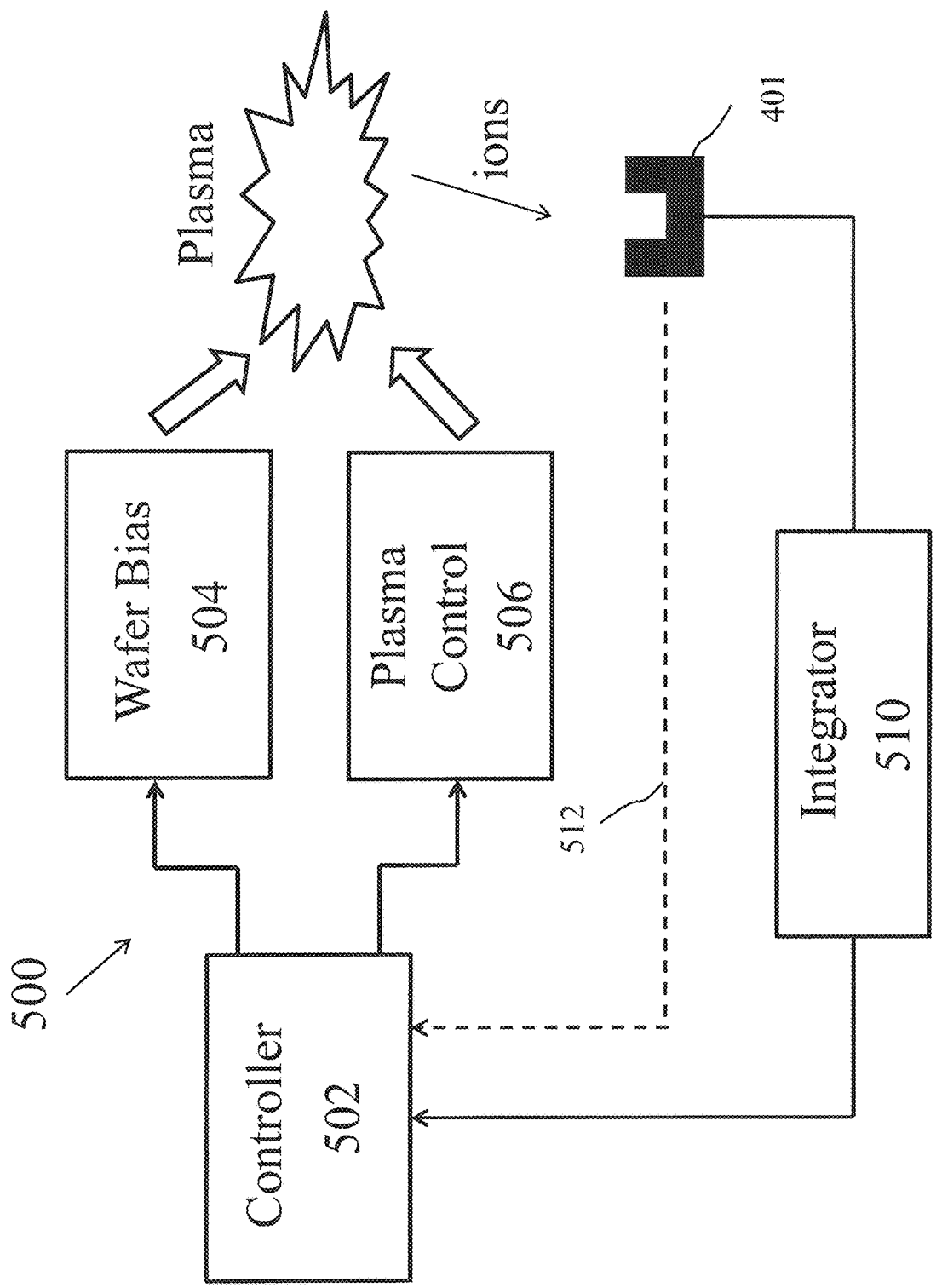
FIG. 5 illustrates a control system, in accordance with some embodiments.

FIG. 5 illustrates a control system 500 for correcting non uniformity of the ion distribution across a wafer, according to an embodiment. Control system 500 may be used with the continuous ion collector design illustrated in FIG. 4. Control system 500 includes a controller 502 that includes processing circuitry and/or logic designed to receive ion distribution information from integrator 510 and use that information to control parameters of the plasma system to compensate for any non-uniform measurements in real time. According to an embodiment, controller 502 also receives position data 512. Position data 512 includes information about the location of window 404 as it moves over conductive element 401 of the continuous ion collector. Position data 512 may be collected using any of the various techniques for monitoring the location of window 404 mentioned previously. Position data 512 is then received by controller 502 and is correlated with the ion distribution information received from integrator 510 to determine a general location where a given ion distribution is measured. Alternatively, if a rotation speed of cover 402 is controlled and known, then controller 502 may also correlate the received ion distribution information from integrator 510 with the time that it is received to determine a general location where a given ion distribution is measured.

Controller 502 may be capable of shutting off the plasma source if the non-uniformity is greater than a given threshold. This may be based on any number of possible comparisons. For example, if the received ion distribution information changes more than a threshold amount during the time that window 404 makes one full revolution, then controller 502 would shut off the plasma source and issue a warning or alert to the user that the system requires maintenance. The user could also be provided with information that includes specifically which area registered the highest or lowest ion distribution reading. Other methods of comparing measurements to determine a degree of uniformity would be understood to a person skilled in the art.

In an embodiment, upon receipt of the ion distribution information from integrator 510, controller 502 may adjust the bias voltage applied to all of (or portions of) the wafer (or wafers) being processed in an attempt to correct the plasma uniformity in real time. Block 504 represents the adjustment being made to the wafer bias potential. The change to the wafer bias changes the electric field strength around the wafer, which in turn affects how the ions interact with the wafer surface.

Alternatively, or additionally, upon receipt of the ion distribution information from integrator 510, controller 502 may adjust parameters of the plasma source to affect characteristics of the plasma. Block 506 represents the adjustment being made to the plasma source. Examples of plasma parameters to control include gas concentrations, gas flow rates, and E-field intensity. A multi-zone plasma system may be controlled to affect the plasma over specific regions of the wafer. For example, if the ion distribution measurements show an abnormal reading (e.g., too high or too low) for a given area around the outside of wafer 104, then the multi-zone plasma system may be adjusted by controller 502 such that the ion concentration (or total ion charge) would change primarily over a section of wafer 104 nearest to the area where the abnormal reading was received from. In another example, the multi-zone plasma system may be adjusted by controller 502 to affect the ion concentration over various sections of wafer 104.

Controller 502 may continuously monitor the received ion distribution measurements and determine that no change needs to be made to any of the plasma system parameters. For example, if the ion distribution measurements continue to remain within a given threshold over time, controller 502 may continue to monitor, but not take any action to change either the wafer bias potential (block 504) or the plasma source parameters (block 506.)

Figure 6:
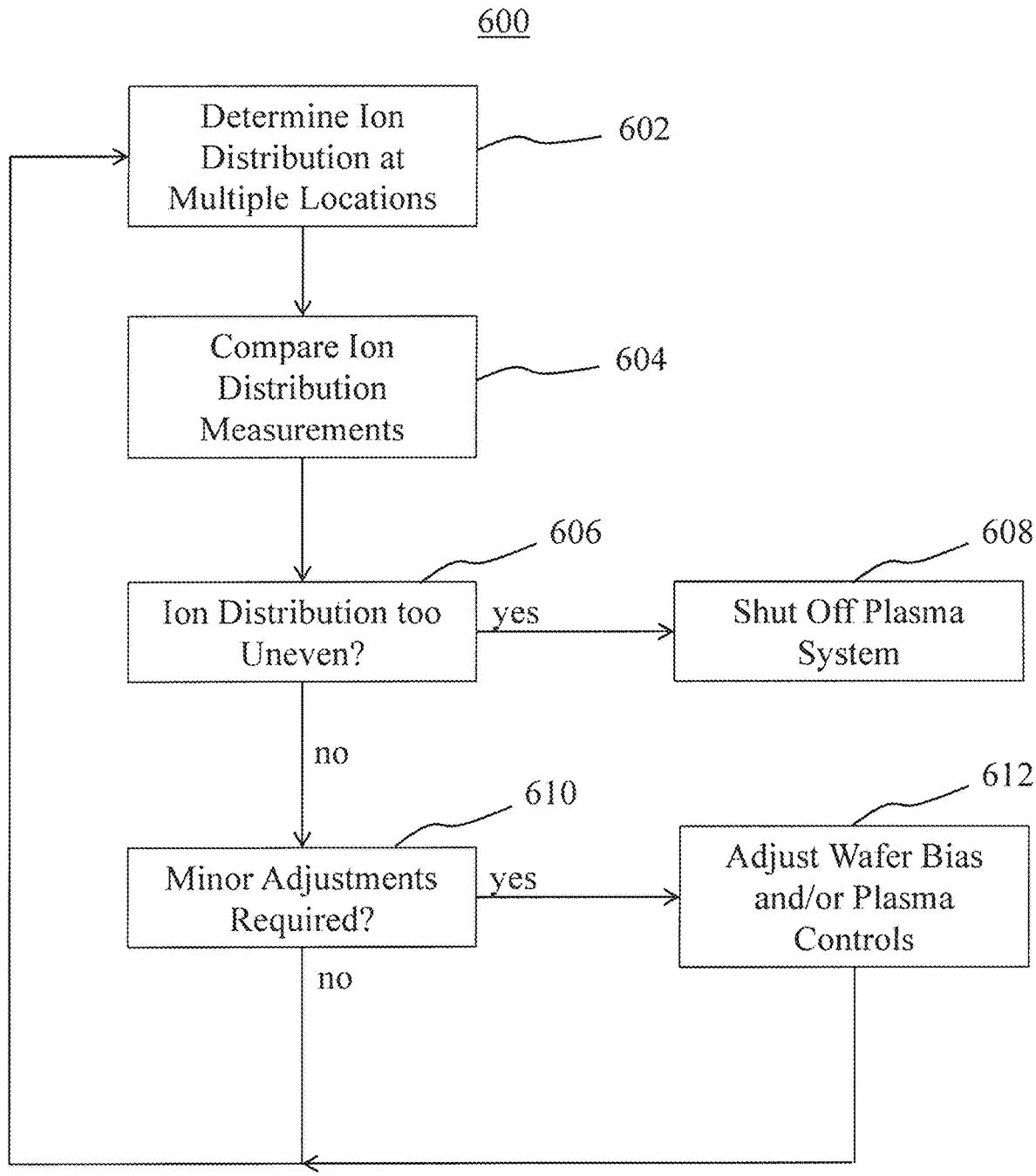
FIG. 6 illustrates an example method, in accordance with some embodiments.

FIG. 6 illustrates a flowchart of a method 600, according to an embodiment. Method 600 may be performed by either ion collector design illustrated in FIG. 1A or FIG. 4. Method 600 may be the steps of an algorithm executed by controller 302/502 in concert with integrator 310/510. It should be understood that other steps not illustrated may also be performed without deviating from the scope or spirit of the embodiments described herein.

Method 600 starts at block 602 where the ion distribution is determined from different locations around a wafer (or around a group of wafers), according to an embodiment. The ion distribution at different locations may be determined based on current measurements from various segments or based on a current measurement from a continuous conductive element of an ion collector where the ions only impact a controlled portion of the continuous conductive element. The ion distribution may be determined by an integrator that receives the current measurement(s) from the conductive element(s) of the ion collector.

At block 604, the ion distribution measurements may be compared/contrasted to estimate how uniform the ion distribution is across the wafer, according to an embodiment. This comparison may be performed by controller 302/502. The comparison may involve any mathematical technique used to compare different measurements as would be understood to one skilled in the art. Some examples of measurement comparisons were given above when describing FIGS. 3 and 5.

At block 606, a determination is made whether the compared ion distribution measurements indicate that the uniformity of the ion distribution is too uneven across the wafer, according to an embodiment. For example, if the compared measurements indicate that the discrepancy between various ion distribution measurements is greater than a given threshold, then the plasma system may be shut off at block 608. This threshold may be set to a value that indicates that the plasma system is too far out of its normal operating state to be adjusted in real time, and that it must be shut down to be serviced.

If the ion distribution is not determined to be too uneven (e.g., the measurements are within a given threshold), method 600 continues to block 610 where a determination is made if minor adjustments to the system parameters are required, according to an embodiment. This determination may be made based on a second threshold different from the threshold used to determine if the plasma system needed to be shut down. For example, the ion distribution measurements may exhibit some non-uniform behavior that isn't high enough to be greater than the threshold at block 606, but is high enough to be greater than the second threshold at block 610. If the discrepancy between the ion distribution measurements is greater than the second threshold than the method proceeds to block 612 where minor adjustments may be performed in real-time while the plasma system is still operating. The minor adjustments may involve changing a bias voltage applied to the wafer or a wafer chuck holding the wafer. The minor adjustments may involve adjusting parameters of the plasma source to affect characteristics of the plasma.

If it is determined in block 610 that minor adjustments are not required (e.g., the ion distribution measurements exhibit good uniformity across the wafer), then method 600 proceeds back to block 602 where ion distribution at different locations is continually monitored and method 600 repeats. Additionally, after performing adjustments at block 612, method 600 returns to block 602 to continue monitoring the ion distribution at different locations.

Figure 7:
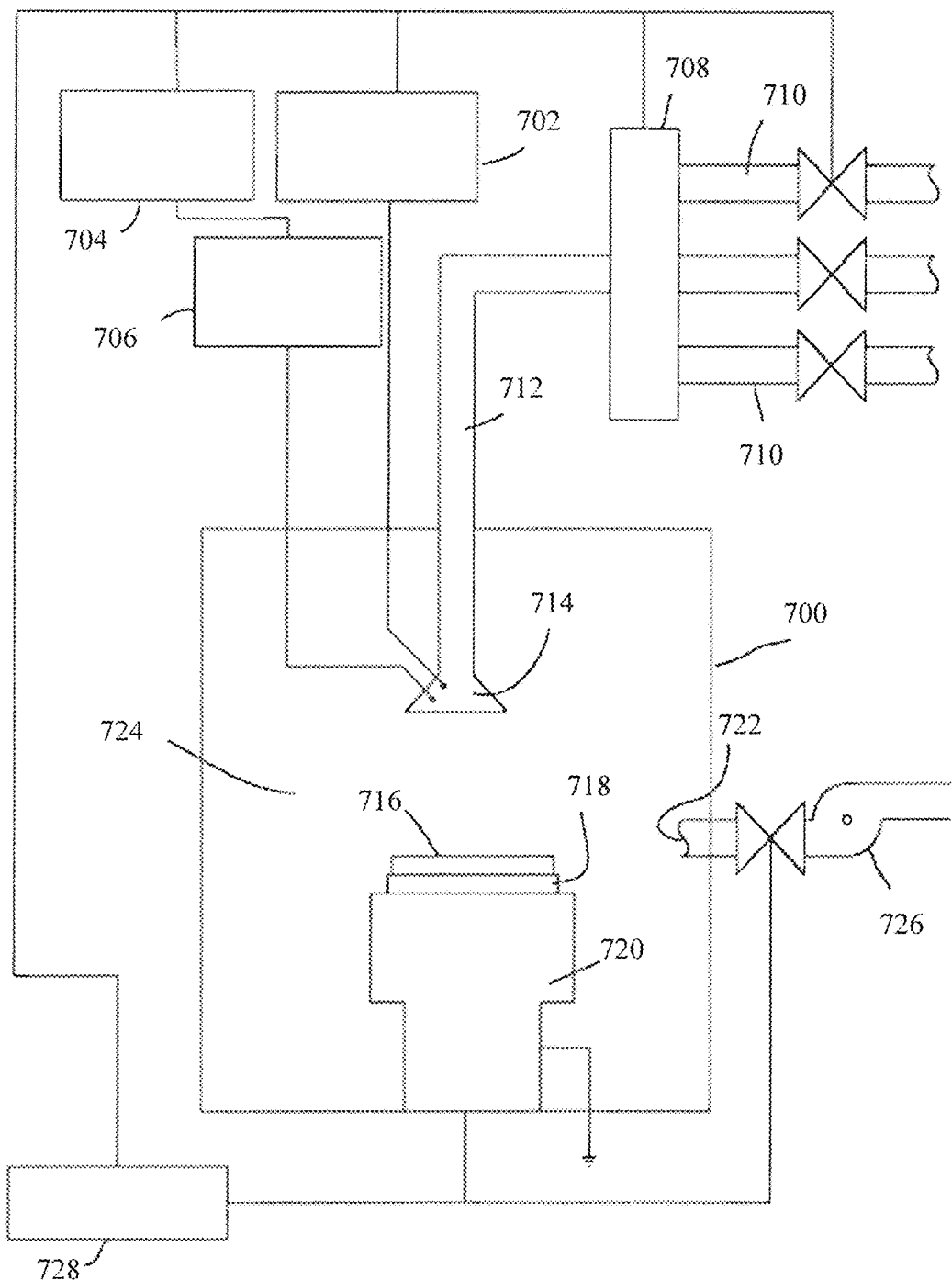
FIG. 7 illustrates an example plasma chamber for use with some embodiments.

FIG. 7 provides a simple block diagram depicting various components of an example plasma chamber that may implement embodiments of the present disclosure. As shown, a reactor 700 includes a process chamber 724, which encloses other components of the reactor and serves to contain the plasma generated by a capacitor type system including a showerhead 714 working in conjunction with a grounded heater block 720. A high-frequency (HF) RF generator 702 and a low-frequency (LF) RF generator 704 may be connected to showerhead 714. An impedance matching network 706 may be included with either or both of HF generator 702 and LF generator 704. In an alternative embodiment, LF generator 704 is connected to, or located below, a wafer stage 718. The power and frequency supplied by HF generator 702 may be sufficient to generate a plasma from a process gas/vapor. In a typical process, the HF generator is operated generally at frequencies in a range from about 2 MHz to about 60 MHz. The power output may be about 3.3 kW. The LF generator is operated generally at frequencies in a range from about 100 kHz to about 800 kHz.

Within reactor 700, wafer stage 718 supports a substrate 716. Wafer stage 718 may include a chuck, a fork, or lift pins to hold and transfer substrate 716 during and between the deposition and/or plasma treatment reactions. The chuck may be an electrostatic chuck, a mechanical chuck or various other types of chuck as are available for use in the industry and/or research. Wafer stage 718 may be functionally coupled with grounded heater block 720 for heating substrate 716 to a desired temperature. Generally, substrate 716 is maintained at a temperature in a range from about 25° C. to about 500° C.

Wafer stage 719 may be arranged to deliver high voltage pulses to substrate 716 during a plasma process. The pulses may be in a range from about −0.2 kV to about −10 kV (for directing positive ions towards substrate 716, negative ions would use positive pulses), from about 20 microseconds to about 100 microseconds long, and at a frequency in a range from about 0.5 kHz to about 10 kHz.

According to an embodiment, wafer stage 718 includes segments of an ion collector (such as segments 106*a*-106*h* illustrated in FIG. 1A) arranged around substrate 716. According to another embodiment, wafer stage 718 includes an ion collector having a cover (such as conductive element 401 and cover 402 illustrated in FIG. 4) arranged around substrate 716.

Process gases/vapors may be introduced via inlet 712. Multiple source gas lines 710 are connected to manifold 708. The gases/vapors may be premixed or not in the manifold. Appropriate valving and mass flow control mechanisms are employed to ensure that the correct gases are delivered during the deposition and plasma treatment phases of the process. In case the chemical precursor(s) is delivered in the liquid form, liquid flow control mechanisms are employed. The liquid is then vaporized and mixed with other process gases during its transportation in a manifold heated above its vaporization point before reaching the deposition chamber.

Process gases exit chamber 724 via an outlet 722. A vacuum pump 726 (e.g., a one or two stage mechanical dry pump and/or a turbomolecular pump) typically draws process gases out and maintains a suitably low pressure within reactor 700 by a close loop controlled flow restriction device, such as a throttle valve or a pendulum valve. Pressures in reaction chamber 724 may be maintained in a range from about 0.1 Torr to about 30 Torr.

In certain embodiments, a system controller 728 is employed to control process conditions and other process operations of reactor 700. Controller 728 will typically include one or more memory devices and one or more processors. The processor may include a CPU or computer, analog and/or digital input/output connections, stepper motor controller boards, etc.

Controller 728 may control all of the activities of reactor 700. Controller 728 may execute system control software including sets of instructions for controlling the timing of the processing operations, frequency and power of operations of LF generator 702 and HF generator 704, flow rates and temperatures of precursors and inert gases and their relative mixing, temperature of the heater block 720, pressure of the chamber, and other parameters of a particular process. According to an embodiment, controller 728 may also receive as an input a signal from segments of an ion collector arranged around substrate 716, and use that received signal to control various processes of reactor 700.

Figure 8:
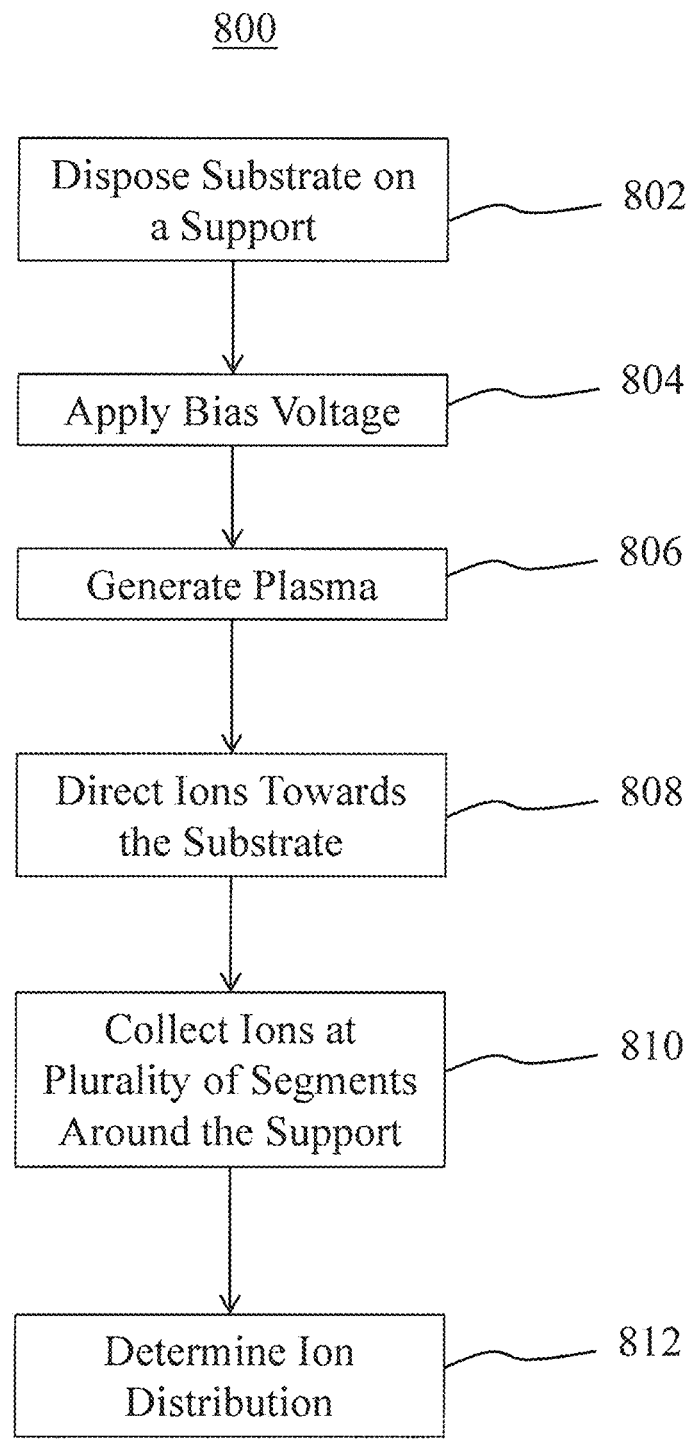
FIG. 8 illustrates an example method, in accordance with some embodiments.

FIG. 8 illustrates a flowchart of a method 800, according to an embodiment. Method 800 may be performed using a plasma system (such as plasma chamber 1 in FIG. 7) that includes either ion collector design illustrated in FIG. 1A or FIG. 4. It should be understood that other steps not illustrated may also be performed without deviating from the scope or spirit of the embodiments described herein.

Method 800 starts at block 802 where a substrate is disposed on a support within a plasma chamber. For example, a substrate may be placed on puck 810 from FIG. 7.

At block 804, a voltage bias is applied to the substrate via the support it is placed upon. This voltage bias may be a DC voltage applied to form an electric field within the plasma chamber to direct ions towards the substrate. The voltage bias may be applied via a controller that receives input from a user or is autonomously generated.

At block 806 a plasma is generated within the plasma chamber. The plasma may be generated from any number of ways as would be understood by a person skilled in the art. For example, the plasma may be generated by flowing in one or more gases that are ionized via RF energy. The frequency and amplitude of the RF energy may be changed to affect the properties of the plasma. Similarly, the gas(es) used, or flowrate of the gas(es) into the plasma chamber, may be changed to affect the properties of the plasma.

At block 808, the ions from the plasma are directed towards the substrate on the support. How fast the ions are driven towards the substrate may depend on the voltage bias applied to the substrate.

At block 810, at least some of the ions are collected at a plurality of segments around the support. For example, each segment of the plurality of segments includes a conductive element that is designed to conduct a current based on the ions received from the plasma. The plurality of segments are each spaced some distance apart on the support around where the substrate is placed (like the example illustrated in FIG. 1A.) In another embodiment, the ions are collected at a single conductive element through a window that rotates around the conductive element as described in more detail in FIG. 4 and its accompanying description.

At block 812, the ion distribution is determined based on the received current from each of the plurality of conductive elements. The ion distribution measurements may be compared/contrasted to estimate how uniform the ion distribution is across the wafer, according to an embodiment. This comparison may be performed by, for example, controller 302/502. The comparison may involve any mathematical technique used to compare different measurements as would be understood to one skilled in the art. Some examples of measurement comparisons were given above when describing FIGS. 3 and 5.

The plasma ion distribution may be monitored during various fabrication steps of making a finFET. Some example process steps of a finFET device is shown in FIGS. 9-12. These steps provide a lightly doped drain (LDD) plasma process, according to an embodiment. It should be understood that the finFET device illustrated in FIGS. 9-12 is just an example of such a device with certain features omitted for clarity. Other fabrication steps and material layers may be included in the finFET device.

Figure 9A:
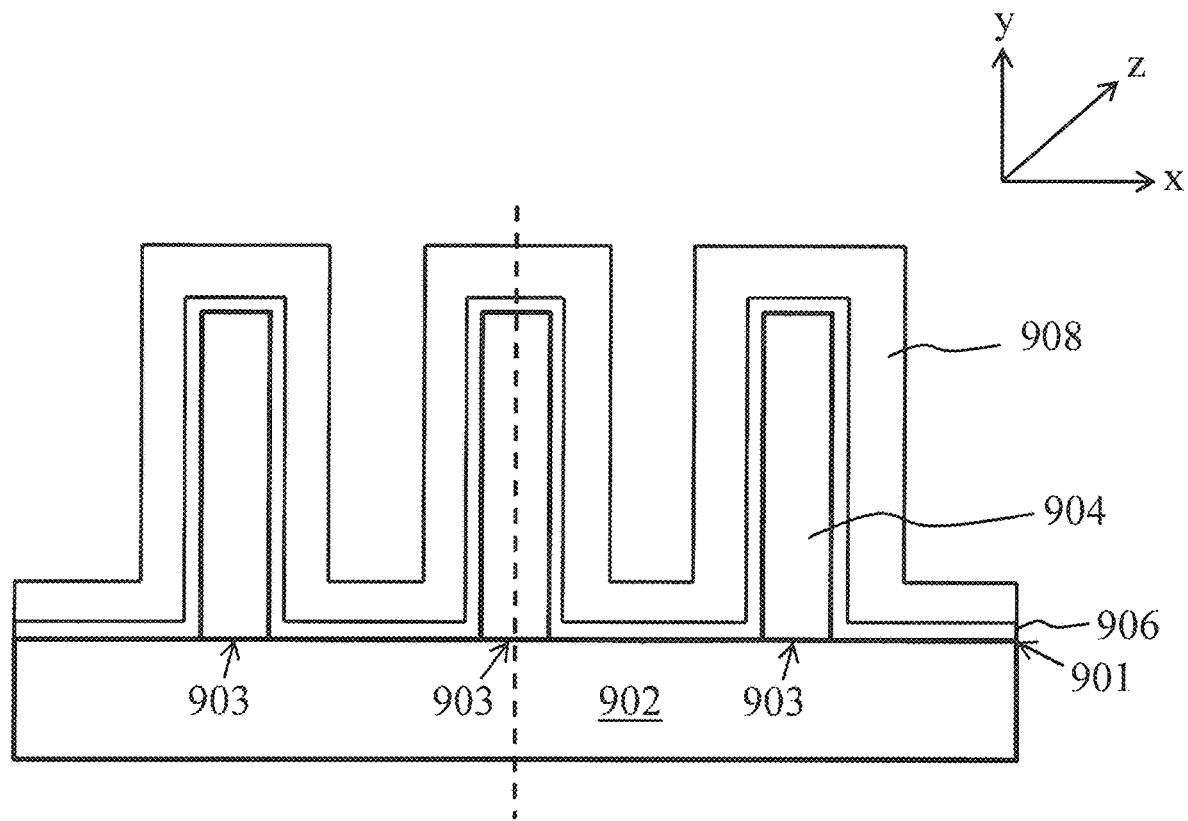
FIGS. 9A-9B illustrate a processing step of an example finFET device, in accordance with some embodiments.
Figure 9B:
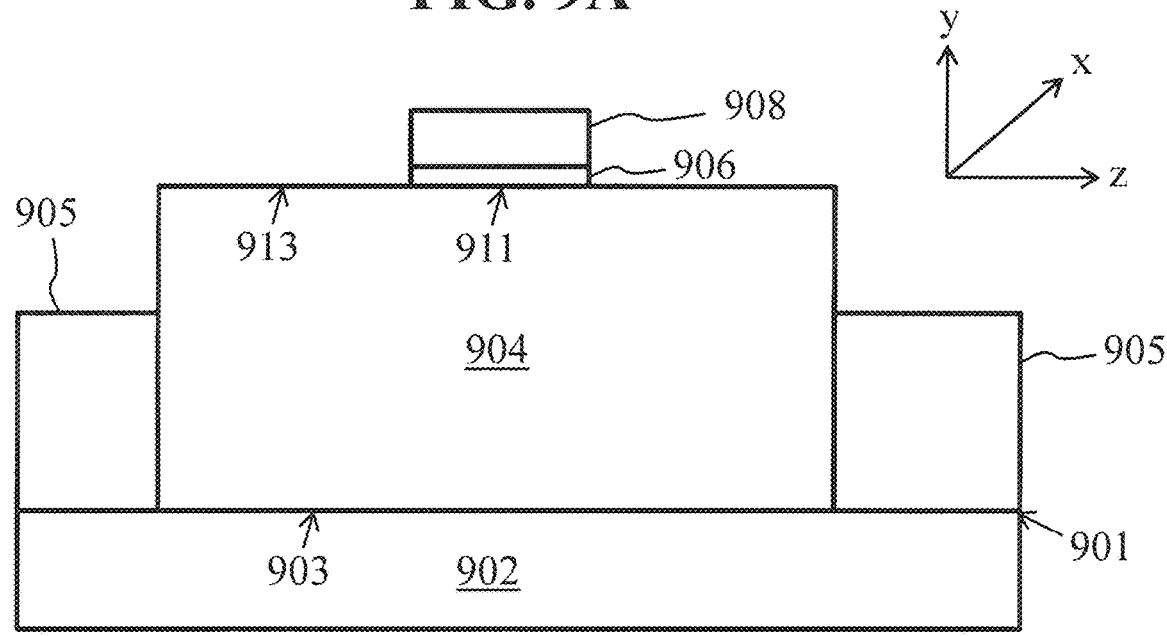

FIG. 9A is a side view in the X-Y plane of three fins 904 of a finFET device on a substrate 902, in accordance with some embodiments. FIG. 9B provides a cross-section view in the Y-Z plane of one fin through the dotted line illustrated in FIG. 9A, in accordance with some embodiments. Each finFET device includes a semiconductor fin 904 having a dielectric layer 906 and a gate layer 908. Semiconductor fin 904 and substrate 902 are commonly silicon, though other semiconducting materials such as gallium arsenide or indium phosphide may be used as well. Example dielectric layers include silicon dioxide, nitride, and low-K dielectric materials. Dielectric layer 906 may comprise a stack of insulating material layers. Gate layer 908 is commonly doped polysilicon, but it may also be a metal such as copper, gold, aluminum, or a metal alloy. Gate layer 908 may comprise a stack of conductive material layers. In some embodiments, each fin 904 includes isolation region 905 to separate the source/drain regions of adjacent fins. Isolation region 905 may be silicon trench isolation (STI) using an insulating material such as, for example, silicon dioxide.

Gate layer 908 is polysilicon, according to an embodiment. The patterning of the polysilicon layer may be performed by using a hard mask including a silicon nitride layer and an oxide layer. Dielectric layer 906 may be silicon oxide formed by CVD, PVD, ALD, e-beam evaporation, or other suitable process. In some embodiments, dielectric layer 906 may include one or more layers of silicon oxide, silicon nitride, silicon oxy-nitride, or high-k dielectric materials. High-k dielectric materials may comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. In some embodiments, a thickness of dielectric layer 906 is in the range of about 1 nm to about 5 nm. In some embodiments, dielectric layer 906 may include an interfacial layer made of silicon dioxide. In some embodiments, dielectric layer 906 may comprise a single layer or multilayer structure. Gate layer 908 may be doped polysilicon with uniform or non-uniform doping. In some alternative embodiments, gate layer 908 includes a metal such as Al, Cu, W, Ti, Ta, TiN, TiAl, TiAlN, TaN, NiSi, CoSi, other conductive materials with a work function compatible with the substrate material, or combinations thereof. Gate layer 908 may be formed using a suitable process such as ALD, CVD, PVD, plating, or combinations thereof. The width of gate layer 908 (in the Z direction) is in the range of about 30 nm to about 60 nm in some embodiments.

The finFET device includes an interface 903 between fins 904 and substrate 902, an interface 901 between dielectric layer 906 and substrate 902, an interface 911 between dielectric layer 906 and fin 904 on the top surface of fin 904, and an interface 913 along a top surface of fin 904. In an embodiment, interface 903 is coplanar with interface 901. In other embodiments, interface 903 is either above or below interface 901. In an embodiment, interface 911 is coplanar with interface 913. In other embodiments, interface 911 is either above or below interface 913.

Figure 10A:
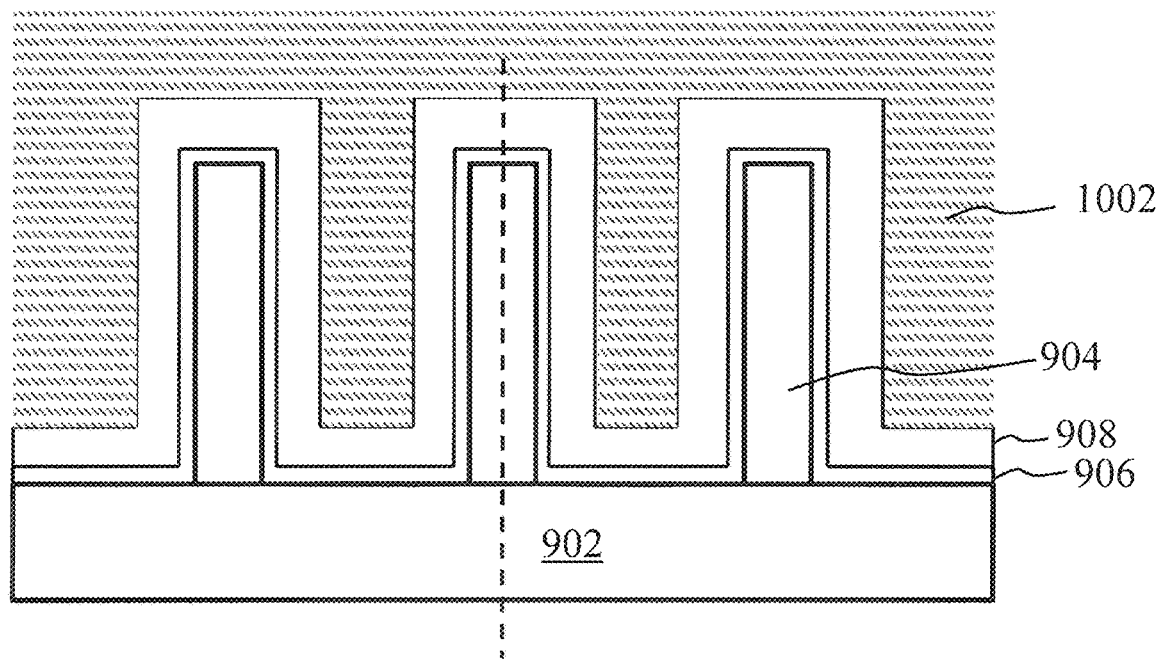
FIGS. 10A-10B illustrate another processing step of an example finFET device, in accordance with some embodiments.
Figure 10B:
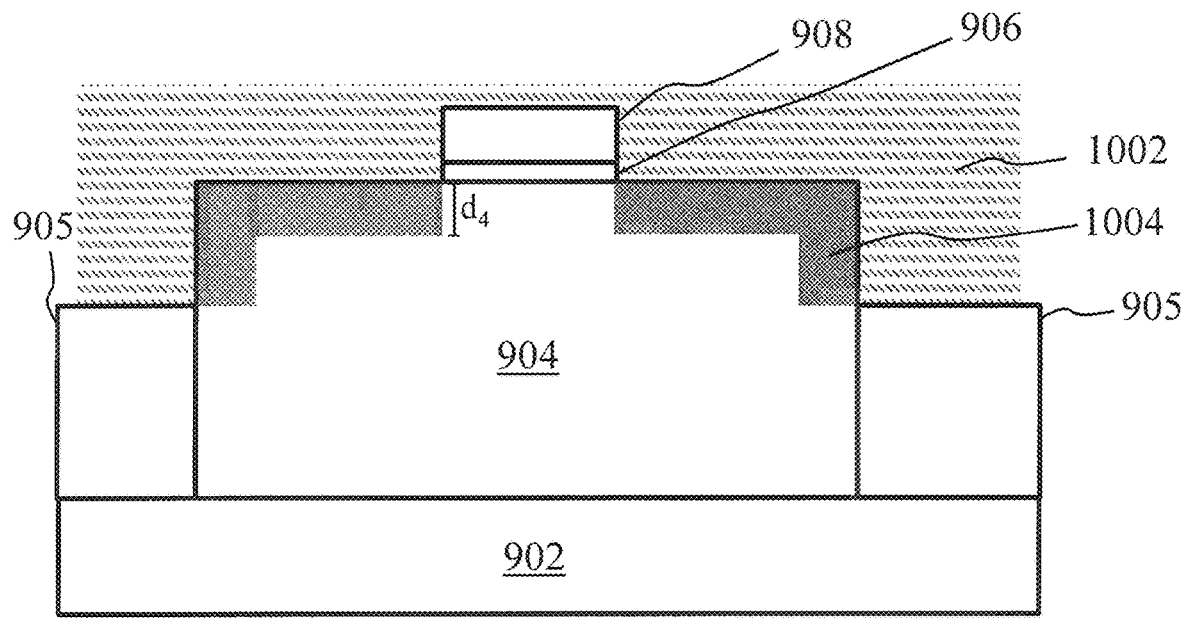

FIGS. 10A and 10B illustrate a first plasma doping process using plasma 1002, according to an embodiment. Plasma doping has an advantage of being able to get between the fins to more easily to provide a conformal doping profile. In one embodiment, the plasma includes an arsenic gas ($AsH_3$) to provide n-type dopants to the fins. Another doping gas example is $B_2H_6$ (for providing p-type dopants). The plasma is also commonly mixed with an inert gas such as helium, xenon, or argon. This first doping step provides a first concentration of dopants represented by region 1004 in semiconductor fins 904. As can be seen in FIG. 10B, doped region 1004 extends into fin 904 at a depth $d_4$. In an embodiment, the depth $d_4$ may be in a range from about 1 nm to about 10 nm. In another embodiment, the depth $d_4$ may be in a range from about 10 nm to about 50 nm. The uniformity of this doping step across the wafer is important to reduce variation in device performance. The uniformity of the plasma doping step may be monitored using any of the ion collector embodiments described herein.

Figure 11:
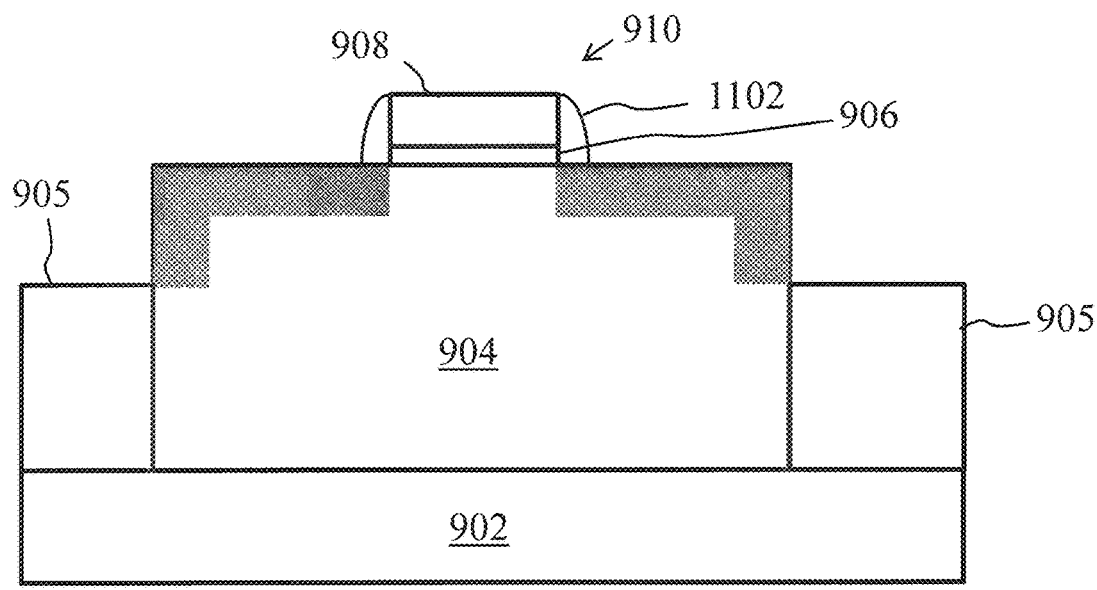
FIG. 11 illustrates another processing step of an example finFET device, in accordance with some embodiments.

FIG. 11 illustrates the cross-section view of the finFET device with patterned spacers 1102 formed after the first doping step, according to an embodiment. Spacers 1102 maybe formed from nitride or silicon dioxide, though other materials are possible as well. Spacers 1102 may be formed via an etch-back technique where the material layer is deposited and then etched such that the material only remains on the sidewalls of structures.

Gate structure 910 includes gate layer 908 patterned over dielectric layer 906, with spacers 1102 patterned along the sidewalls of the stack including both gate layer 908 and dielectric layer 906. In some embodiments, gate layer 908 is used as a hard mask for etching dielectric layer 906.

Figure 12:
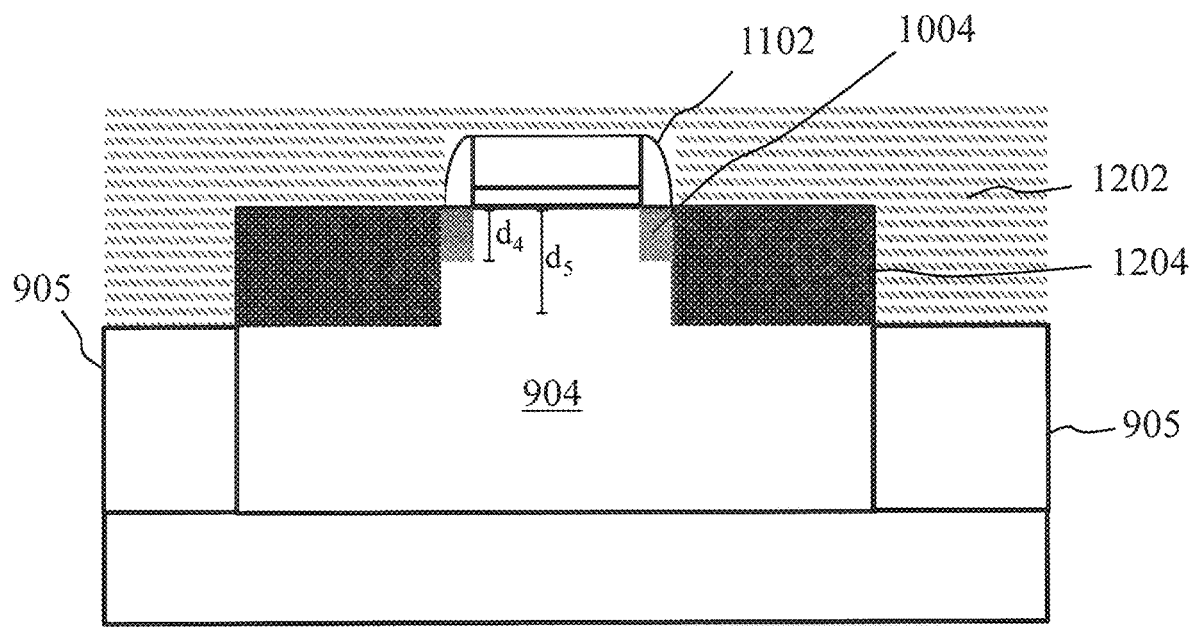
FIG. 12 illustrates another processing step of an example finFET device, in accordance with some embodiments.

FIG. 12 illustrates the cross-section view of the finFET device having patterned spacers 1102 during a second plasma doping step using plasma 1202, according to an embodiment. The second plasma gas provides a higher concentration of dopants to doped region 1204. Spacers 1102 protect the lighter doped region 1004 during the second plasma doping step. The second plasma doping step causes dopants to extend at a depth $d_5$ into fin 904. In an embodiment, the depth $d_5$ may be in a range from about 5 nm to about 15 nm. In another embodiment, the depth $d_5$ may be in a range from about 15 nm to about 55 nm. The uniformity of this doping step across the wafer is important to reduce variation in device performance. The uniformity of the plasma doping step may be monitored using any of the ion collector embodiments described herein.

Figure 13:
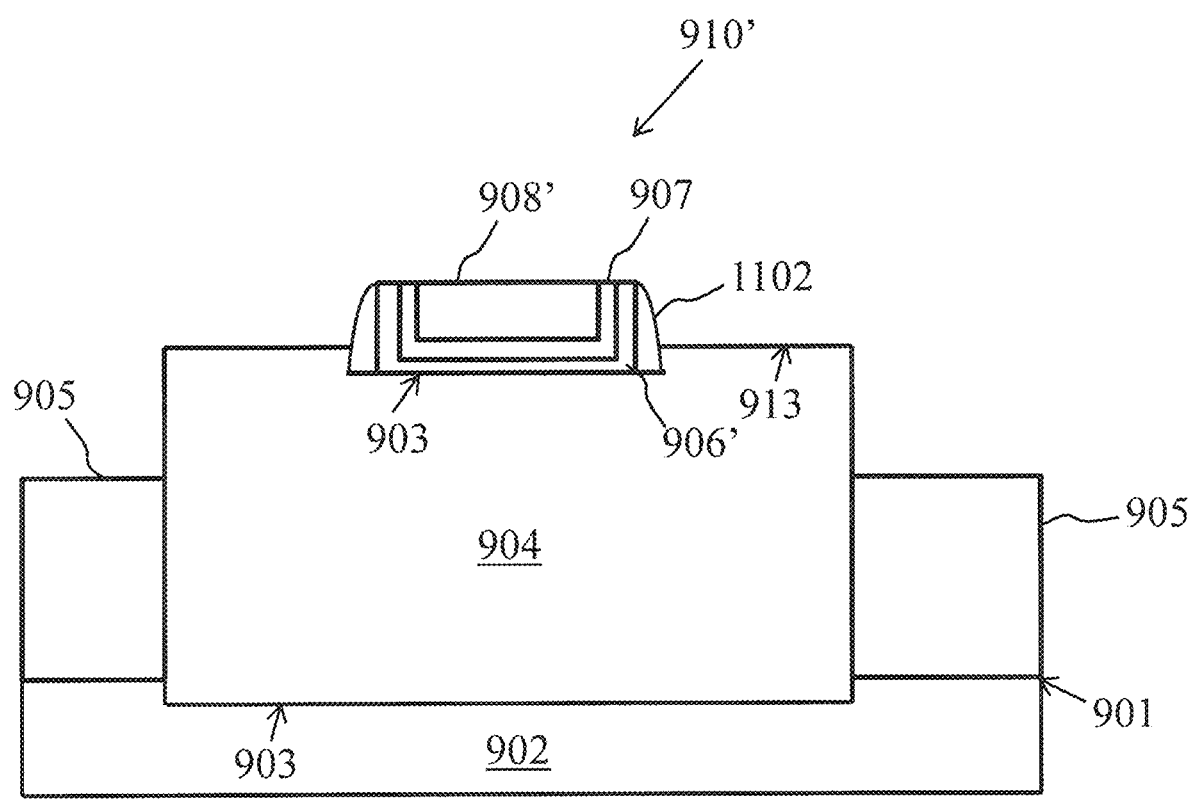
FIG. 13 illustrates an example finFET device, in accordance with some embodiments.

FIG. 13 illustrates a finFET device having a different gate structure 910', according to another embodiment. Gate structure 910' includes gate layer 908' and dielectric layer 906', which are similar to gate layer 908 and dielectric layer 906 illustrated with reference to FIG. 9B. Gate structure 910' also includes one or more work function layers 907 disposed between gate layer 908' and dielectric layer 906'.

In the finFET device illustrated in FIG. 13, interface 913 at the top surface of fin 904, and not under dielectric layer 906', is higher than interface 903 between dielectric layer 906' and fin 904, according to an embodiment. Interface 901 between isolation region 905 and substrate 902 is higher than interface 903 between fin 904 and substrate 902, according to an embodiment.

Example Embodiments and Benefits

In various embodiments, an ion collector includes a plurality of segments and a plurality of integrators. The plurality of segments are physically separated from one another and spaced around a substrate support. Each of the segments includes a conductive element that is designed to conduct a current based on ions received from a plasma. Each of the plurality of integrators is coupled to a corresponding conductive element. Each of the plurality of integrators is designed to determine an ion distribution for a corresponding conductive element based, at least in part, on the current conducted at the corresponding conductive element. An example benefit of this embodiment includes the ability to determine how uniform the ion distribution is across a wafer being processed by the plasma.

Various embodiments the ion collector described herein may be used during a plasma doping process, such as the plasma doping process illustrated in FIGS. 9-12. The uniformity across one or more wafers during these plasma doping steps may be measured by determining the ion distribution collected at various segments of an ion collector spaced around the one or more wafers. The embodiments of the ion collector described herein increase the accuracy of the uniformity measurement across the one or more wafers, resulting in better system control and a higher device yield.

In various embodiments, an ion collector includes a conductive element having a closed shape arranged on a substrate support, wherein the conductive element is configured to generate a current based on ions received from a plasma. The ion collector also includes a cover disposed over the conductive element. The cover has an opening over one part of the conductive element, and the cover is designed to move across the closed shape of the conductive element such that the opening correspondingly moves across the closed shape of the conductive element. The ion collector also includes an integrator coupled to the conductive element. The integrator determines an ion distribution for a portion of the conductive element exposed to the plasma under the opening in the cover. The ion distribution is determined, at least in part, based on a current generated at the conductive element. An example benefit of this embodiment includes the ability to determine how uniform the ion distribution is across a wafer being processed by the plasma.

In some embodiments, an ion distribution is measured at a plurality of individually measurable locations around a substrate support. The measured ion distribution is compared between at least two of the individually measurable locations and the parameters of the plasma system are adjusted if a difference between the measured plasma energy is greater than a threshold. An example benefit of this embodiment includes the ability to determine how uniform the ion distribution is across a wafer being processed by the plasma.

In some embodiments, a substrate is disposed on a support within a plasma chamber. A bias voltage is applied to the substrate, and a plasma system is used to generate a plasma within the plasma chamber. The ions are directed from the plasma towards the substrate. The method includes collecting at least some of the ions at a plurality of segments physically separated from one another and spaced around the support, wherein each segment of the plurality of segments includes a conductive element configured to conduct a current based on the ions received from the plasma. The method further includes determining an ion distribution for a corresponding conductive element based, at least in part, on the current conducted at the corresponding conductive element.

It is to be appreciated that the Detailed Description section, and not the Abstract section, is intended to be used to interpret the claims. The Abstract section may set forth one or more but not all exemplary embodiments of the present invention as contemplated by the inventor(s), and thus, is not intended to limit the present invention and the appended claims in any way.

Embodiments of the present invention have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. An ion collector, comprising:
a plurality of conductive elements physically separated from one another and radially arranged around a substrate, wherein each conductive element of the plurality of conductive elements is disposed at a same radial distance from the substrate and is configured to conduct a current based on ions received from a plasma;
a plurality of integrators, wherein each integrator of the plurality of integrators is coupled to a respective conductive element and is configured to determine an ion distribution for the respective conductive element based on the current conducted at the respective conductive element; and
a controller coupled to the plurality of integrators, wherein the controller is configured to determine a difference between the ion distribution from at least two conductive elements and adjust a parameter controlling the ion distribution according to a comparison between the difference and a threshold voltage.

2. The ion collector of claim 1, wherein a distance between each of the conductive elements and its two nearest neighboring conductive elements is the same for each of the conductive elements.

3. The ion collector of claim 1, further comprising a plurality of magnetic elements, wherein each magnetic element of the plurality of magnetic elements is coupled to a respective conductive element.

4. The ion collector of claim 1, wherein the controller is configured to receive the ion distribution from each of the plurality of integrators.

5. The ion collector of claim 1, wherein the parameter controlling the ion distribution is a bias voltage of the substrate.

6. The ion collector of claim 1, wherein the parameter controlling the ion distribution is a bias voltage to a portion of the substrate.

7. The ion collector of claim 1, wherein the controller is further configured to shut off the plasma if the difference is greater than the threshold voltage by a given amount.

8. A plasma control system, comprising:
a plurality of arc-shaped segments radially arranged around a substrate, wherein each arc-shaped segment of the plurality of arc-shaped segments is disposed at a same radial distance from the substrate;
a plurality of integrators, wherein each integrator of the plurality of integrators is coupled to a respective arc-shaped segment and is configured to determine an ion distribution for the respective arc-shaped segment, wherein the ion distribution at each of the arc-shaped segments corresponds to an ion distribution on a respective circular sector region of the substrate; and
a controller coupled to the plurality of integrators, wherein the controller is configured to determine a difference between the ion distribution from at least two arc-shaped segments and selectively apply a bias voltage to at least one of the circular section regions.

9. The plasma control system of claim 8, wherein each of the arc-shaped segments is disposed adjacent to the respective circular sector region of the substrate and a total number of the arc-shaped segments is equal to a total number of the circular sector regions.

10. The plasma control system of claim 8, wherein a distance between each of the arc-shaped segments and its two nearest neighboring arc-shaped segments is the same for each of the arc-shaped segments.

11. The plasma control system of claim 8, wherein the arc-shaped segments are electrically isolated from each other.

12. The plasma control system of claim 8, further comprising a plurality of magnetic elements, wherein each magnetic element of the plurality' of magnetic elements is coupled to a respective arc-shaped segments.

13. The plasma control system of claim 8, wherein the controller is configured to receive the ion distribution from each of the plurality of integrators.

14. The plasma control system of claim 8, wherein the controller is configured to adjust the bias voltage in response to the difference being greater than the threshold voltage.

15. A system, comprising:
conductive elements radially arranged around a substrate, wherein each of the conductive elements is disposed at a same radial distance from the substrate and is configured to conduct a current based on ions received from a plasma;
integrators coupled to the conductive elements and configured to determine an ion distribution at each of the conductive elements; and
a controller coupled to the integrators and configured to:
determine a difference between the ion distribution from at least two of the conductive elements at the same radial distance from the substrate;
compare the difference with a threshold voltage; and
selectively adjust a bias voltage applied to a portion of the substrate in response to the difference being greater than the threshold voltage to correct a non-uniformity of the ion distribution across the substrate.

16. The system of claim 15, wherein the controller is further configured to selectively adjust the bias voltage applied to the portion of the substrate in real time to correct a non-uniformity of the ion distribution across the substrate.

17. The system of claim 15, wherein a distance between each of the conductive elements and its two nearest neighboring conductive elements is the same for each of the conductive elements.

18. The system of claim 15, wherein the conductive elements are electrically isolated from each other.

19. The system of claim 15, wherein each of the conductive elements is disposed at a distance of about 2 mm to about 5 mm away from an edge of the substrate to measure uniformity of the ion distribution across the substrate.

20. The system of claim 15, wherein the controller is further configured to adjust one or more parameters of the plasma.

* * * * *